US010180341B2

(12) United States Patent
Dudley et al.

(10) Patent No.: US 10,180,341 B2
(45) Date of Patent: Jan. 15, 2019

(54) MULTI-LAYER WIRELESS SENSOR CONSTRUCT FOR USE AT ELECTRICALLY-CONDUCTIVE MATERIAL SURFACES

(71) Applicant: The United States of America as represented by the Administator of the National Aeronautics and Space Administration, Washington, DC (US)

(72) Inventors: Kenneth L. Dudley, Newport News, VA (US); George N. Szatkowski, Charlottesville, VA (US); Chuantong Wang, Newport News, VA (US); Laura J. Smith, Yorktown, VA (US); Larry A. Ticatch, Yorktown, PA (US); Truong X. Nguyen, Hampton, VA (US); Jay J. Ely, Yorktown, VA (US); Sandra V. Koppen, Suffolk, VA (US)

(73) Assignee: THE UNITED STATES OF AMERICA AS REPRESENTED BY THE ADMINISTRATOR OF NASA, Washington, DC (US)

( * ) Notice: Subject to any disclaimer, the term of this patent is extended or adjusted under 35 U.S.C. 154(b) by 847 days.

(21) Appl. No.: 14/520,785

(22) Filed: Oct. 22, 2014

(65) Prior Publication Data

US 2015/0204709 A1    Jul. 23, 2015

Related U.S. Application Data

(60) Provisional application No. 61/895,129, filed on Oct. 24, 2013.

(51) Int. Cl.
*G01F 23/26* (2006.01)
*H05H 1/46* (2006.01)
*G01R 33/12* (2006.01)

(52) U.S. Cl.
CPC .......... *G01F 23/26* (2013.01); *G01F 23/261* (2013.01); *G01R 33/1223* (2013.01); *H05H 1/46* (2013.01)

(58) Field of Classification Search
CPC ... G01F 23/26; G01F 23/261; G01R 33/1223; H05H 1/2406; H05H 1/46; H05H 2001/2412; H05H 2001/2456
See application file for complete search history.

(56) References Cited

U.S. PATENT DOCUMENTS 5,349,271 A    9/1994  Van Os et al.
5,436,528 A    7/1995  Paranjpe
(Continued)

FOREIGN PATENT DOCUMENTS

GB    2293050 A    3/1996

OTHER PUBLICATIONS

Dudley et al., Damage Detection Response Characteristics of Open Circuit Resonant (SansEC) Sensors.pdf, Sep. 18, 2013.*
(Continued)

*Primary Examiner* — Randy Gibson
*Assistant Examiner* — Gedeon M Kidanu
(74) *Attorney, Agent, or Firm* — Robin W. Edwards; Mark P. Dvorscak

(57) ABSTRACT

A multi-layer wireless sensor construct is provided. The construct includes a first dielectric layer adapted to be attached to a portion of a first surface of an electrically-conductive material. A layer of mu metal is provided on the first dielectric layer. A second dielectric layer is provided on the layer of mu metal. An electrical conductor is provided on the second dielectric layer wherein the second dielectric layer separates the electrical conductor from the layer of mu metal. The electrical conductor has first and second ends and is shaped to form an unconnected open-circuit that, in the (Continued)

presence of a time-varying magnetic field, resonates to generate a harmonic magnetic field response having a frequency, amplitude and bandwidth.

4 Claims, 3 Drawing Sheets

(56) References Cited

U.S. PATENT DOCUMENTS

| | | | |
|---|---|---|---|
| 5,874,704 A | 2/1999 | Gates | |
| 7,037,604 B2* | 5/2006 | Witcraft | G01R 33/09 257/295 |
| 7,086,593 B2* | 8/2006 | Woodard | B60C 23/0449 235/435 |
| 7,159,774 B2 | 1/2007 | Woodard et al. | |
| 8,430,327 B2 | 4/2013 | Woodard et al. | |
| 2004/0019272 A1* | 1/2004 | Witcraft | G01R 33/09 600/410 |
| 2005/0007239 A1 | 1/2005 | Woodard et al. | |
| 2007/0181683 A1* | 8/2007 | Woodard | H04Q 9/00 235/451 |
| 2008/0184795 A1* | 8/2008 | Woodard | G01R 33/1223 73/304 C |
| 2009/0040116 A1* | 2/2009 | Eray | G06K 19/07749 343/702 |
| 2009/0072814 A1 | 3/2009 | Woodard et al. | |
| 2009/0109005 A1 | 4/2009 | Woodard et al. | |
| 2009/0273429 A1 | 11/2009 | Nakamura et al. | |
| 2009/0277789 A1* | 11/2009 | Woodard | G01N 29/036 204/416 |
| 2009/0302111 A1 | 12/2009 | Woodard et al. | |
| 2010/0026202 A1 | 2/2010 | Siessegger | |
| 2010/0059692 A1* | 3/2010 | Quick, II | G21B 1/00 250/492.1 |
| 2010/0109818 A1 | 5/2010 | Woodard et al. | |
| 2010/0233821 A1* | 9/2010 | Woodard | G01N 27/021 436/149 |
| 2011/0274139 A1* | 11/2011 | Woodard | G01K 7/38 374/120 |
| 2011/0292969 A1 | 12/2011 | Woodard | |
| 2012/0271564 A1* | 10/2012 | Dudley | B64D 45/02 702/34 |
| 2013/0033271 A1 | 2/2013 | Woodard | |

OTHER PUBLICATIONS

Dudley et al. Damage Detection Response Characteristics of Open Circuit Resonant (SansEC) Sensors. 2013 ICOLSE International Conference on Lightning and Static Electricity, Sep. 17-20, 2013, pp. 1-13, Seattle, Washington.
PCT International Search Report PCT/US2014/062124, pp. 1-10, dated Feb. 6, 2015.
PCT International Search Report PCT/US2014/062102, pp. 1-12, dated Feb. 10, 2015.
PCT International Search Report PCT/US2014/062097, pp. 1-12, dated Feb. 9, 2015.
Urrutia, et al. "Nonlinear electron magnetohydrodynamic physics. VI. Magnetic loop antenna across the ambient field", Phys Plasmas, 2009, vol. 16, pp. 022102-1-022102-10.
Woodard, Stanley E., "A Magnetic Field Response Recorder: A New Tool for Measurement Acquisition," 5th Annual IEEE Conference on Sensors, Oct. 22-25, 2006, pp. 789-797, Daegu, Korea.
Woodard, Stanley E. et al., "Measurement of Multiple Unrelated Physical Quantities using a Single Magnetic Field Response Sensor," Measurement Science and Technology, 2007, vol. 18 pp. 1603-1613.
Smith, Douglas C. et al., "Signal and Noise Measurement Techniques Using Magnetic Field Probes," 1999 IEEE International Symposium on Electromagnetic Compatibility, Aug. 2-6, 1999, pp. 559-563, Seattle Washington.
Ely, Jay J. et al, "Investigation of Electromagnetic Field Threat to Fuel Tank Wiring of a Transport Aircraft," Mar. 2000, NASA/TP-2000-209867, pp. 1-200.
ETS Lindgren, Model 7405 Near-Field Probe Set User Manual, 1999, pp. 1-51.

* cited by examiner

MULTI-LAYER WIRELESS SENSOR CONSTRUCT FOR USE AT ELECTRICALLY-CONDUCTIVE MATERIAL SURFACES

CROSS-REFERENCE TO RELATED PATENT APPLICATION(S)

This patent application claims the benefit of and priority to U.S. Provisional Application Ser. No. 61/895,129, filed on Oct. 24, 2013, the contents of which are hereby incorporated by reference in their entirety. In addition, this application is related to co-pending patent applications titled "ANTENNA FOR FAR FIELD TRANSCEIVING," U.S. patent application Ser. No. 14/520,863, and "PLASMA GENERATOR USING SPIRAL CONDUCTORS," U.S. patent application Ser. No. 14/520,679, filed on the same day and owned by the same assignee as this patent application, the contents of which are hereby incorporated by reference in their entirety.

STATEMENT REGARDING FEDERALLY SPONSORED RESEARCH OR DEVELOPMENT

The invention described herein was made in the performance of work under a NASA contract and by employees of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor elected not to retain title.

BACKGROUND OF THE INVENTION

Modern aerospace vehicles (e.g., airplanes, rotorcraft, unmanned aerial vehicles, airships, rockets, and spacecraft) are designed to utilize a variety of lightweight and strong composite materials. One class of these composite materials is referred to generally as "carbon fiber reinforced plastics" (CFRPs). These materials are being incorporated into frame structures as well as various components. For example, liquid reservoirs such as fuel tanks are being constructed from CFRPs.

Measuring the quantity of fuel in an aerospace vehicle's fuel tank is a continuous and critical function. Traditionally, fuel quantity measurement has been accomplished by one or more probes that must be immersed in the fuel. The probes are typically of the electronic-capacitive type which requires electrical penetrations through the fuel storage tank. Electrical penetrations through a fuel tank as well as routing of wire within a fuel tank are not optimum solutions. Though the intended interrogation signals on the wires to the fuel probes are low in power level, the potential for other higher powered unwanted interference signals both man-made and natural can couple onto fuel tank electrical penetrations creating unwanted or even disastrous results. For example, a lightning strike on or in the near vicinity of the air vehicle can induce strong electrical currents on the wiring that penetrates the fuel tank.

Recently, a new class of wireless sensing systems have been developed that use open-circuit, electrically-conductive spiral trace sensors. Details of these sensors and sensing systems are described in U.S. Pat. No. 8,430,327. Briefly, the described wireless sensing system includes a sensor made from an electrical conductor shaped to for an open-circuit, electrically-conductive spiral trace having inductance and capacitance. In the presence of a time-varying magnetic field, the sensor resonates to generate a harmonic response having a frequency, amplitude and bandwidth. A magnetic field response recorder wirelessly transmits the time-varying magnetic field to the sensor and wirelessly detects the sensor's response. Unfortunately, the above-described wireless sensor and sensing system will not function when used on or near conductive materials (such as components made from CFRPs) since the conductive material shields and absorbs the electromagnetic energy generated by the sensor.

BRIEF SUMMARY OF THE INVENTION

The present invention is a multi-layer wireless sensor construct for attachment to a first surface of an electrically-conductive material. The construct can be used in the sensing of the presence of a liquid at a second surface of the electrically-conductive material. The wireless sensor construct includes a first dielectric layer adapted to be attached to a portion of the first surface of the electrically-conductive material. A layer of mu metal is provided on the first dielectric layer wherein the first dielectric layer separates the layer of mu metal from the first surface of the electrically-conductive material. A second dielectric layer is provided on the layer of mu metal. An electrical conductor is provided on the second dielectric layer wherein the second dielectric layer separates the electrical conductor from the layer of mu metal. The electrical conductor has first and second ends and is shaped to form a spiral between its first and second ends. The first and second ends remain electrically unconnected such that the electrical conductor so-shaped is maintained as an unconnected single-component open-circuit having inductance and capacitance. In the presence of a time-varying magnetic field, the electrical conductor so-shaped resonates to generate a harmonic magnetic field response having a frequency, amplitude and bandwidth.

One embodiment of the invention is a system for indicating a quantity of liquid in a container that is electrically conductive. A plurality of the above-described wireless sensor constructs are adapted to be attached to an exterior wall region of the container, N magnetic field response recorder having an antenna wirelessly transmits the time-varying magnetic field to each construct's electrical conductor so-shaped and wirelessly detects the harmonic magnetic field response generated thereby. The magnetic field response recorder has an electrical impedance $Z_{SOURCE}$ that is exclusive of electrical impedance of the antenna. A total electrical impedance $Z_{TOTAL}$ is approximately matched to the electrical impedance $Z_{SOURCE}$. The total electrical impedance $Z_{TOTAL}$ is defined by a parallel combination of the electrical impedance of the antenna, electrical impedance of the electrical conductor so-shaped, electrical impedance of the layer of mu metal, and electrical impedance of a portion of the container bounded by an outer periphery of the layer of mu metal.

Another embodiment of the invention is a system for storing a liquid and for indicating a quantity of the liquid so-stored. The system includes a container made from an electrically conductive material and a plurality of the above-described wireless sensor constructs attached to the container. A magnetic field response recorder has an antenna that wirelessly transmits the time-varying magnetic field to the electrical conductor so-shaped and wirelessly detects the harmonic magnetic field response generated thereby. As in the previous embodiment, the magnetic field response recorder has an electrical impedance $Z_{SOURCE}$ exclusive of electrical impedance of the antenna. A total electrical impedance $Z_{TOTAL}$ is approximately matched to the electrical impedance $Z_{SOURCE}$. The total electrical impedance $Z_{TOTAL}$ is defined by a parallel combination of the electrical impedance of the antenna, electrical impedance of the electrical conductor so-shaped, electrical impedance of the layer of mu metal, and electrical impedance of a portion of the container bounded by an outer periphery of the layer of mu metal.

Yet another embodiment of the invention is a system for storing a liquid and for indicating a quantity of the liquid so-stored. The system includes a container and a plurality of wireless sensor constructs. Each wireless sensor construct is attached to an exterior surface region of the container. Each wireless sensor construct includes an electrical conductor so-shaped as in the previous embodiments and an electromagnetic window that is transparent to the harmonic magnetic field response of the electrical conductor so-shaped. The electromagnetic window is disposed between the electrical conductor so-shaped and an interior region of the container. A magnetic field response recorder having an antenna is also included. A total electrical impedance $Z_{TOTAL}$ is approximately matched to the electrical impedance $Z_{SOURCE}$ of the magnetic field response recorder. The total electrical impedance $Z_{TOTAL}$ is defined by a parallel combination of the electrical impedance of the antenna, electrical impedance of the electrical conductor so-shaped, and electrical impedance of the electromagnetic window.

These and other features, advantages, and objects of the present invention will be further understood and appreciated by those skilled in the art by reference to the following specification, claims, and appended drawings.

DETAILED DESCRIPTION OF THE INVENTION

Figure 1:
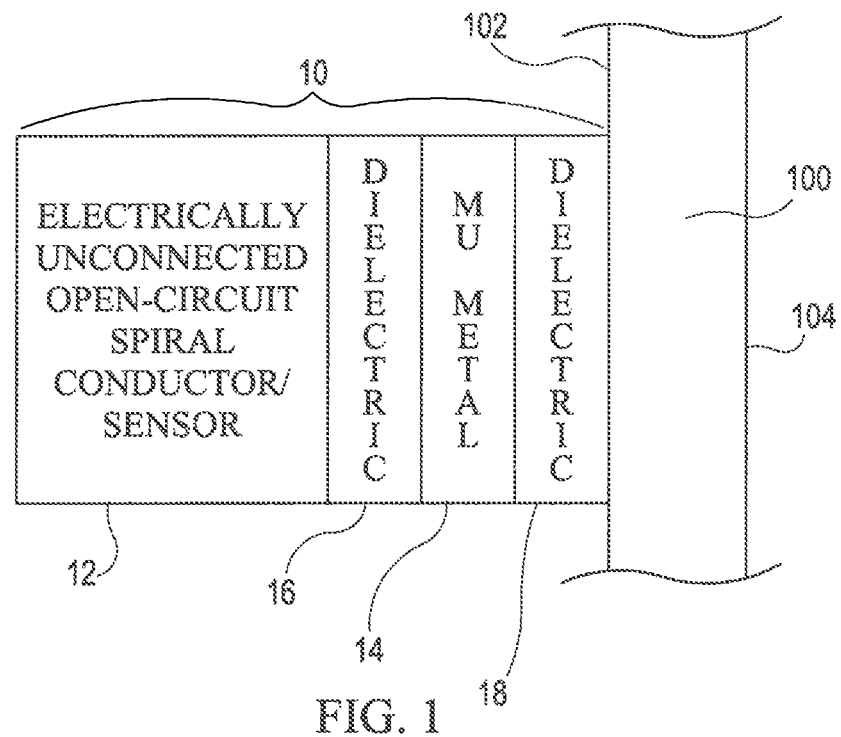
FIG. 1 is a schematic view of a multi-layer wireless sensor construct for attachment to an electrically-conductive material in accordance with an embodiment of the present invention.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Referring now to the drawings and more particularly to FIG. 1, a multi-layer wireless sensor construct in accordance with an embodiment of the present invention is shown and is referenced generally by numeral 10. Wireless sensor construct 10 is shown attached to a surface 102 of an electrically-conductive material 100. In general and as will be explained further below, wireless sensor construct 10 can be part of a system used to sense the presence or absence of liquid at an opposing surface 104 of material 100 at a region thereof aligned with wireless sensor construct 10. The liquid (not shown) can be water, fuel, sewage, or any other liquid retained by material 100. Accordingly, in many applications, material 100 is part of a container.

Figure 2:
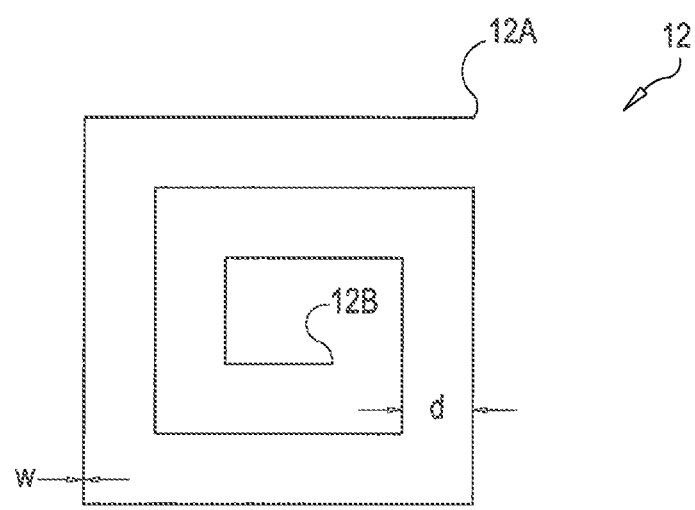
FIG. 2 is an isolated schematic view of an electrically-unconnected spiral sensor used in the wireless sensor construct in accordance with an embodiment of the present invention.

Wireless sensor construct 10 is a multi-layer device that provides for non-invasive sensing of liquid adjacent surface 104 from surface 102, does not require any electrical connections thereto, does not require any penetrations of material 100, and does not require any electrical wires to pass through material 100. Wireless sensor construct 10 includes an electrically unconnected, open-circuit spiral conductor sensor 12. Sensor 12 and its attributes are described in detail in U.S. Pat. No. 8,430,327, the entire contents of which are hereby incorporated by reference, Briefly, and with reference to FIG. 2, spiral trace sensor 12 is made from an electrically-conductive run or trace. More specifically, spiral trace sensor 12 is a spiral winding of conductive material with its ends 12A and 12B remaining open or unconnected. Accordingly, spiral trace sensor 12 is said to be an open-circuit. Techniques used to construct or deposit spiral trace sensor 12 on a substrate material can be any conventional metal-conductor deposition process to include thin-film fabrication techniques. In the illustrated embodiment, spiral trace sensor 12 is constructed to have a uniform trace width throughout (i.e., trace width W is constant) with uniform spacing (i.e., spacing d is constant) between adjacent portions of the spiral trace. However, it is to be understood sensor 12 is not limited to a uniform width conductor spirally wound with uniform spacing as illustrated in FIG. 2.

In order to sense the presence/absence of a liquid at surface 104, the harmonic response of sensor 12 must be able to penetrate material 100. That is, an electromagnetic window must be defined adjacent sensor 12 such that the harmonic response of sensor 12 can pass through material 100 and such that the harmonic response changes (owing to the presence or absence of a liquid at surface 104 aligned with sensor 12) can be detected by sensor 12. In the illustrated embodiment, the electromagnetic window is provided by a layer 14 of a high permeability material such as the class of materials known as mu metals (e.g., nickel-iron alloy).

Layer 14 is disposed between sensor 12 and conductive material 100 to control the field coupling and enable sensor operation. The depth that induced currents can penetrate into a material is affected by the frequency of the excitation current, and the conductivity and magnetic permeability of the substrate material. While the depth of penetration decreases with increasing frequency and increasing conductivity and magnetic permeability, the degree of penetration can in principle be increased by the creating a saturation magnetic field. To create a saturation magnetic field, the present invention employs materials with high magnetic permeability.

The general configuration of wireless sensor construct 10 includes a stack defined by sensor 12 over a thin electrical isolating dielectric layer 16 over mu metal layer 14 that is electrically isolated from material 100 by a dielectric layer 18. Dielectric layers 16 and 18 can incorporate adhesive properties to maintain the integrity of construct 10 and provide the means to attach construct 10 to surface 102. The high permeability layer 14 is used to concentrate the magnetic field inside the high permeability material to enable sensor 12 to self-resonate. By covering or tiling the sensor area with high permeability material, the current density can be increased at surface 102 of material 100 thereby allowing the magnetic field to be more effectively coupled.

As mentioned above, the high permeability materials used for layer 14 can be thin metallic films composed of a nickel-iron alloy and are commonly referred to as mu metals or high μ materials. Mu metal layer 14 increases the magnetic field produced by sensor 12 and correspondingly increases the penetration depth of the magnetic field into material 100. Layer 14 also maintains a high density magnetic flux in the very narrow space of the thickness of layer 14 to sustain the oscillating magnetic fields (both the external driving magnetic field and the sensor-produced magnetic field) from being totally shielded and absorbed by material 100.

Figures 3A, 3B:
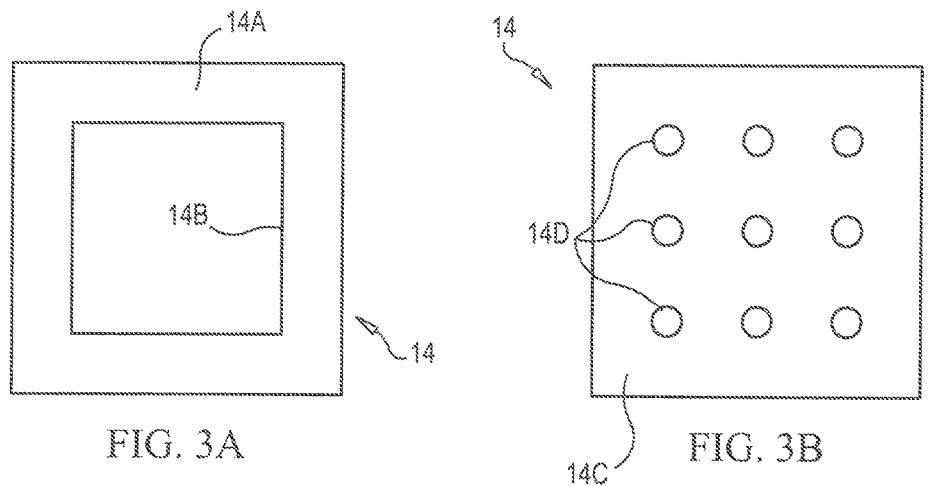
FIG. 3A is an isolated plan view of the wireless sensor construct's mu metal layer in accordance with an embodiment of the present invention.
FIG. 3B is an isolated plan view of the wireless sensor construct's mu metal layer in accordance with another embodiment of the present invention.

Mu metal layer 14 can be a solid sheet of material spanning to or beyond the outer dimensions of sensor 12. However, mu metal layer 14 could be configured in other ways to adjust its above-described functions. For example, mu metal layer 14 could have one or more holes as in the examples illustrated in FIGS. 3A and 3B. More specifically, FIG. 3A illustrates a "picture frame" mu metal layer 14 defined by a frame 14A of mu metal material surrounding a single hole 14B. FIG. 3B illustrates a multiple-hole mu metal layer 14 defined by a contiguous layer 14C of mu metal material 14C with a plurality of holes 14B. While holes 14D are all circular and are the same size, the holes could be different shapes/sizes and be arranged irregularly in the mu metal layer without departing from the scope of the present invention.

Figure 4:
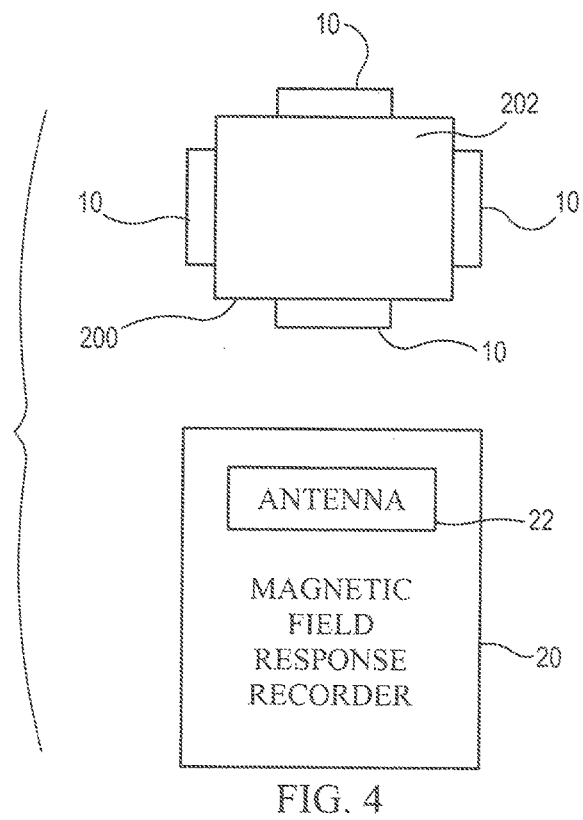
FIG. 4 is a schematic view of a system for indicating a quantity of liquid in an electrically-conductive container in accordance with an embodiment of the present invention.

A plurality of the wireless sensor constructs of the present invention can be used as part of a liquid quantity indication system. A simple embodiment of such a system is shown by way of example in FIG. 4 where a top view of a liquid container 200 having an interior region 202 is illustrated. The particular shape and/or size of container 200 are not limitations of the present invention. For this embodiment, container 200 is made from an electrically-conductive material. For example, container 200 could be made from an electrically-conductive composite known as carbon fiber reinforced plastic (CFRP). The particular composition of the material used to make container 200 is not a limitation of the present invention.

A number of the above-described, wireless sensor constructs 10 are attached to exterior surface regions of container 200 using, for example, adhesive properties of each construct's dielectric layer 18 (FIG. 1) as described above. The particular number of constructs 10 and their positions on container 200 are not limitations of the present invention. In general, the number and positions of wireless sensor constructs 10 are determined by the particular application. For example, if container 200 is a fuel tank for an aircraft or space vehicle, constructs 10 are positioned to provide useful information at a variety of container attitudes roll, pitch and yaw angles) so that a fuel quantity (as opposed to a mere fuel level) can be determined.

Each wireless sensor construct is resonated and monitored by a magnetic field response recorder 20, the details of which are described in the above-referenced U.S. Pat. No. 8,430,327, as well as in U.S. Pat. Nos. 7,086,593 and 7,159,774, the entire contents of which are hereby incorporated by reference. While only one recorder 20 is illustrated, additional ones could be used without departing from the scope of the present invention. Briefly, recorder 20 includes an antenna 22 for transmission of a broadband time-varying magnetic field (causing the constructs' sensors to resonate) and for reception of the harmonic resonance response of the constructs' sensors.

Figure 5:
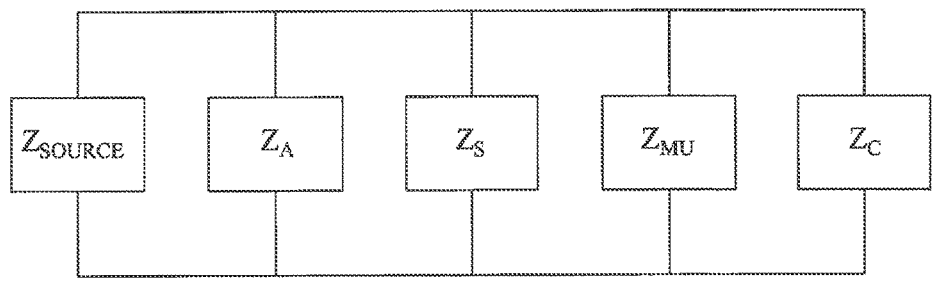
FIG. 5 is a schematic view of an electrical impedance circuit equivalent of a wireless sensor system using the sensor construct in accordance with an embodiment of the present invention.

In order to maximize the coupling of each construct's sensor (i.e., sensor 12) transmission and response through the walls of container 200, the present invention applies an electrical impedance matching approach that will be explained with the aid of FIG. 5. The complex form of impedance or Z (i.e., an equivalent complex impedance that includes all real and imaginary components of resistance, inductance and capacitance) will be used for simplicity. The signal applied by recorder 20 to its antenna 22 has an electrical impedance $Z_{SOURCE}$ that does not include the electrical impedance of antenna 22 (referred to herein as $Z_A$). The electrical impedance of the construct's sensor (i.e., sensor 12 shown in FIG. 1) is $Z_S$. The electrical impedance of the construct's mu metal layer (i.e., mu metal layer 14 shown in FIG. 1) is $Z_{MU}$. The electrical impedance of the portion of container 200 bounded by the periphery of the construct's mu metal layer is $Z_C$. In the present invention, maximum coupling of resonance energy is achieved when $Z_{SOURCE}$ is equal to $Z_{TOTAL}$ where $Z_{TOTAL}$ is the parallel combination of $Z_A$, $Z_S$, $Z_{MU}$ and $Z_C$. The above-described multi-layer construct simplifies the adjustment of $Z_{TOTAL}$ for a particular application. In particular, a wireless sensor construct's mu metal layer is readily adaptable to provide the needed adjustments to achieve the optimal $Z_{TOTAL}$.

Figure 6:
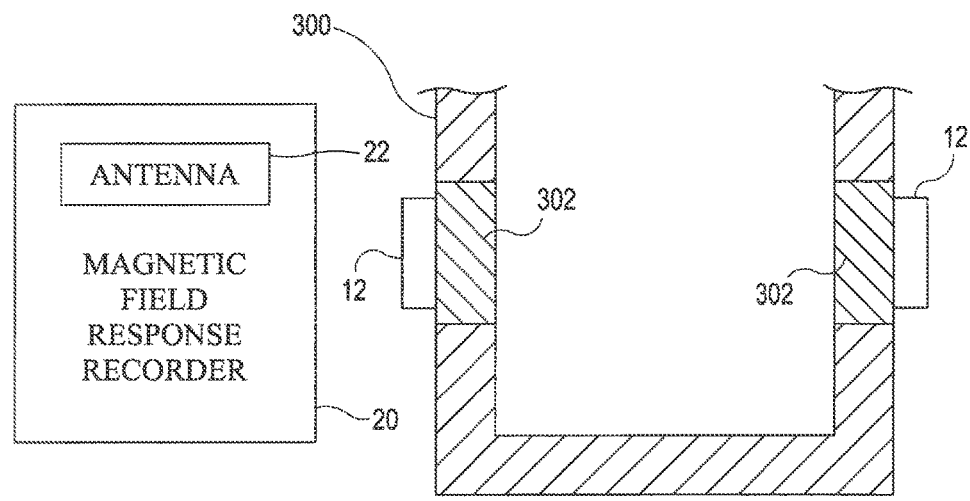
FIG. 6 is a schematic view of a portion of a container configured with electromagnetic energy windows forming a part of a wireless sensor construct in accordance with another embodiment of the present invention.

As described above, the mu metal layer of each wireless sensor construct helps define an "electromagnetic window" through a (container) wall made from an electrically-conductive material. This provides the basis for a wireless liquid quantity indicating system. However, the present invention is not so limited. For example, FIG. 6 illustrates a portion of a container 300 that incorporates electromagnetic windows 302 in the walls thereof where each window 302 is transparent with respect to harmonic magnetic fields (i.e., those generated by a wireless sensor 12 and received by wireless sensor 12). A wireless spiral sensor 12 (as described above) can be coupled directly or indirectly to each window 302 such that a wireless sensor construct is defined by each sensor/window combination. In this embodiment, electrical impedance matching is achieved when $Z_{SOURCE}$ is equal to $Z_{TOTAL}$ where $Z_{TOTAL}$ is the parallel combination of $Z_A$, $Z_S$ and $Z_W$ where $Z_W$ is the electrical impedance of window 302.

The advantages of the present invention are numerous. The wireless sensor construct provides the framework for achieving wireless sensing functions through electrically-conductive materials/walls. When used in groups, the wireless sensor constructs can be activated and interrogated in a wireless fashion to indicate attributes of materials (e.g., liquids) contained by electrically-conductive walls. The present invention can be used to indicate the quantity of liquid (e.g., fuel) in electrically-conductive containers subject to a variety of attitudes.

What is claimed is:

1. A system for indicating a quantity of liquid in a container that is electrically conductive, comprising:
- a plurality of wireless sensor constructs, each of said wireless sensor constructs including:
- a first dielectric layer adapted to be attached to an exterior wall region of the container,
- a layer of mu metal on said first dielectric layer wherein said first dielectric layer separates said layer of mu metal from the exterior wall region, said layer of mu metal having at least one hole passing there through,
- a second dielectric layer on said layer of mu metal wherein said layer of mu metal separates said first dielectric layer from said second dielectric layer, and
- an electrical conductor on said second dielectric layer wherein said second dielectric layer separates said electrical conductor from said layer of mu metal, said electrical conductor having first and second ends and shaped to form a spiral between said first and second ends, said first and second ends remaining electrically unconnected such that said electrical conductor so-shaped is maintained as an unconnected single-component open-circuit having inductance and capacitance wherein, in the presence of a time-varying magnetic field, said electrical conductor so-shaped resonates to generate a harmonic magnetic field response having a frequency, amplitude and bandwidth;
- a magnetic field response recorder having an antenna for wirelessly transmitting said time-varying magnetic field to said electrical conductor so-shaped and for wirelessly detecting said harmonic magnetic field response generated thereby, said magnetic field response recorder having an electrical impedance $Z_{SOURCE}$ exclusive of electrical impedance of said antenna; and
- a total electrical impedance $Z_{TOTAL}$ being approximately matched to said electrical impedance $Z_{SOURCE}$, said total electrical impedance $Z_{TOTAL}$ defined by a parallel combination of said electrical impedance of said antenna, electrical impedance of said electrical conductor so-shaped, electrical impedance of said layer of mu metal, and electrical impedance of a portion of the container bounded by an outer periphery of said layer of mu metal.

2. The system of claim 1, wherein said container comprises a carbon fiber reinforced plastic.

3. A system for storing a liquid and for indicating a quantity of the liquid so-stored, comprising:
- a container;
- a plurality of wireless sensor constructs, each of said wireless sensor constructs attached to an exterior surface region of said container, each of said wireless sensor constructs including:
- an electrical conductor having first and second ends and shaped to form a spiral between said first and second ends, said first and second ends remaining electrically unconnected such that said electrical conductor so-shaped is maintained as an unconnected single-component open-circuit having inductance and capacitance wherein, in the presence of a time-varying magnetic field, said electrical conductor so-shaped resonates to generate a harmonic magnetic field response having a frequency, amplitude and bandwidth, and
- a layer of mu metal having at least one hole passing there through and disposed between said electrical conductor so-shaped and an interior region of said container; and
- a magnetic field response recorder having an antenna for wirelessly transmitting said time-varying magnetic field to said electrical conductor so-shaped and for wirelessly detecting said harmonic magnetic field response generated thereby, said magnetic field response recorder having an electrical impedance $Z_{SOURCE}$ exclusive of electrical impedance of said antenna; and
- a total electrical impedance $Z_{TOTAL}$ being approximately matched to said electrical impedance $Z_{SOURCE}$, said total electrical impedance $Z_{TOTAL}$ defined by a parallel combination of said electrical impedance of said antenna, electrical impedance of said electrical conductor so-shaped, and electrical impedance of said layer of mu metal, and electrical impedance of a portion of said container bounded by an outer periphery of said layer of mu metal.

4. The system of claim 3, wherein said container is made from carbon fiber reinforced plastic.

* * * * *